United States Patent
Good et al.

(10) Patent No.: US 6,959,224 B2
(45) Date of Patent: Oct. 25, 2005

(54) PROBABILITY CONSTRAINED OPTIMIZATION FOR ELECTRICAL FABRICATION CONTROL

(75) Inventors: Richard P. Good, Austin, TX (US); Gregory A. Cherry, Austin, TX (US); Jin Wang, Austin, TX (US)

(73) Assignee: Advanced Micro Devices, Inc., Austin, TX (US)

( * ) Notice: Subject to any disclaimer, the term of this patent is extended or adjusted under 35 U.S.C. 154(b) by 476 days.

(21) Appl. No.: 10/335,748

(22) Filed: Jan. 2, 2003

(65) Prior Publication Data

US 2004/0093107 A1 May 13, 2004

Related U.S. Application Data

(60) Provisional application No. 60/424,944, filed on Nov. 8, 2002.

(51) Int. Cl.[7] .............................................. G06F 19/00
(52) U.S. Cl. ..................... 700/97; 700/29; 700/103; 709/203
(58) Field of Search .......................... 700/97, 95, 28, 700/29, 103, 108; 703/203

(56) References Cited

U.S. PATENT DOCUMENTS

| | | | | |
|---|---|---|---|---|
| 5,105,362 | A | | 4/1992 | Kotani ........................ 364/468 |
| 6,041,270 | A | | 3/2000 | Steffan et al. ............... 700/121 |
| 6,434,441 | B1 | * | 8/2002 | Beauchamp et al. .......... 700/98 |
| 6,442,438 | B1 | * | 8/2002 | Naillon ........................ 700/36 |
| 6,665,572 | B2 | * | 12/2003 | Buervenich et al. ........ 700/103 |

FOREIGN PATENT DOCUMENTS

WO     WO 01/50522 A1     7/2001     ........... H01L/21/66

OTHER PUBLICATIONS

International Search Report PCT/US 03/34848; dated May 3, 2004.

Wagner, A.B. et al. "Interprocess Run–to–Run Feedforward Control for Wafer Patterning" *Control Applications, 1999* Proceedings of the 1999 IEEE International Conference on Kohala Coast, HI, USA Aug. 22–27, 1999, Piscataway, NJ., USA, IEEE, U.S. Aug. 22, 1999, pp. 789–795.

Zhang, Y., "Real–Time Optimization under Parametric Uncertainty: A Probability Constrained Approach", *Journal of Process Control*, vol. 12, No. 3, Apr. 1, 2002, pp. 373, 379–381.

Zhang et al., "Real–Time Optimization under parametric uncertainty: a probability constrained approach," *Journal of Process Control 12 (2002)* 373–389, Sep. 6, 2000.

(Continued)

*Primary Examiner*—Leo Picard
*Assistant Examiner*—Sheela S. Rao
(74) *Attorney, Agent, or Firm*—Williams, Morgan & Amerson

(57) ABSTRACT

A method includes defining a model of a process for manufacturing a device, the process including a plurality of steps. A plurality of inline process targets are defined for at least a subset of the process steps. The model relates the inline process targets to a plurality of process output parameters. A first set of probabilistic constraints for the inline process targets is defined. A second set of probabilistic constraints for the process output parameters is defined. An objective function is defined based on the model and the plurality of process output parameters. A trajectory of the process output parameters is determined by optimizing the objective function subject to the first and second sets of probabilistic constraints for each process step to determine values for the inline process targets at each process step, the optimization being iterated after completion of each process step for the remaining process steps.

27 Claims, 4 Drawing Sheets

OTHER PUBLICATIONS

Adivikolanu et al., "Extensions and Performance/Robustness Tradeoffs of the EWMA Run–to–Run Controller by Using the Internal Model Control Structure," *IEEE Transactions on Electronics Packaging Manufacturing*, vol. 23, No. 1, pp. 56–68, Jan. 2000.

Butler et al., "Supervisory Run–to–Run Control of Polysilicon Gate Etch Using *In Situ* Ellipsometry," *IEEE Transactions on Semiconductor Manufacturing*, vol. 7, No. 2, pp. 193–201, May, 1994.

Chen et al., "Run–to–Run Control of CMP Process Considering Aging Effects of Pad and Disc," *1999 IEEE*, pp. 229–232, Jun. 1999.

Chamness et al., "A Comparison of R2R Control Algorithms for the CMP with Measurement Delays," Prepared for presentations at the AEC/APC XIII Symposium 2001, pp. 1–4.

Dayal et al., "Recursive exponentially weighted PLS and its applications to adaptive control and prediction," *J. Proc. Cont.* vol. 7, No. 3, pp. 169–179, Apr. 2, 1996.

Del Castillo et al., "A multivariate self–tuning controller for run–to–run process control under shift and trend disturbances," *IIE Transactions (1996)* 28, 1011–1021, May 1995.

Del Castillo et al., "Long run and transient analysis of a double EWMA feedback controller," *IIE Transactions* (1999) 31. 1157–1169, Aug. 1997.

Edgar et al., "Automatic control in microelectronics manufacturing: Practices, challenges, and possibilities," www.elsevier.com/locate/automatica, May 28, 1998.

Edgar et al., "Model–Based Control in Microelectronics Manufacturing," 1999 *IEEE*, pp. 4185–2161, Dec. 1999.

Guo, Ruey–Shan et al., "Run–to–Run Control Schemes for CMP Process Subject to Deterministic Drifts," 2000 *IEEE*, pp. 251–259, (2000).

Hankinson et al., "Integrated Real–Time and Run–to–Run Control of Etch Depth in Reactive Ion Etching," *IEEE Transactions on Semiconductor Manufacturing*, vol. 10, No. 1, pp. 121–130, Feb., 1997.

Knight et al., "Real–Time Multivariable Control of PECVD Silicon Nitride Film Properties," *IEEE Transactions on Semiconductor Manufacturing*, vol. 10, No. 1, pp. 137–146, Feb., 1997.

Pavan et al., "Flash Memory Cells–An Overview," *Proceedings of the IEEE*, vol. 85, No. 8, pp. 1248–1271, Aug., 1997.

Qin, Joe S., "Recursive PLS algorithms for adaptive data modeling," 1998 *Computers Chem. Engineering*, vol. 22, No. 4/5, pp. 503–514, Jun. 17, 1996.

Qin et al., "Adaptive Run to Run Control for Intermittent Batch Operations," *Proceedings of the American Control Conference*, Anchorage, AK, pp. 2167–2173, May 8–10, 2002.

Rawlings, James R., "Tutorial: Model Predictive Control Technology," *Proceedings of the American Control Conference*, San Diego, CA., pp. 662–676, Jun., 1999.

Srinivasan et al., "Dynamic optimization of batch processes II. Role of measurements in handling uncertainty," *Computers and Chemical Engineering* 27 (2002) pp. 27–44 www.elsevier.com/locate/compchemeng, Jun. 31, 2000.

Viser et al., "A feedback–based implementation scheme for batch process optimization," *Journal of Process Control* 10 pp. 399–410 www.elsevier.com/locate/jprocont (2000).

Wollstein et al., "Multiple Objective APC Application for an Oxide CMP Process in a high Volume Production Environment," IEEE pp. 207–209 (2001).

Montgomery, Douglas C., "Design and Analysis of Experiments," $5^{th}$ Edition, pp. 484–488 Jun. 2000.

* cited by examiner

PROBABILITY CONSTRAINED OPTIMIZATION FOR ELECTRICAL FABRICATION CONTROL

This application claims the benefit of Provisional Application No. 60/424,944, filed Nov. 8, 2002.

BACKGROUND OF THE INVENTION

1. Field of the Invention

This invention relates generally to an industrial process and, more particularly, to a method and apparatus for determining process targets using a probability constrained optimization with a receding horizon.

2. Description of the Related Art

There is a constant drive within the semiconductor industry to increase the quality, reliability and throughput of integrated circuit devices, e.g., microprocessors, memory devices, and the like. This drive is fueled by consumer demands for higher quality computers and electronic devices that operate more reliably. These demands have resulted in a continual improvement in the manufacture of semiconductor devices, e.g., transistors, as well as in the manufacture of integrated circuit devices incorporating such transistors. Additionally, reducing the defects in the manufacture of the components of a typical transistor also lowers the overall cost per transistor as well as the cost of integrated circuit devices incorporating such transistors.

Generally, a set of processing steps is performed on a wafer using a variety of processing tools, including photolithography steppers, etch tools, deposition tools, polishing tools, rapid thermal processing tools, implantation tools, etc. One technique for improving the operation of a semiconductor processing line includes using a factory wide control system to automatically control the operation of the various processing tools. The manufacturing tools communicate with a manufacturing framework or a network of processing modules. Each manufacturing tool is generally connected to an equipment interface. The equipment interface is connected to a machine interface which facilitates communications between the manufacturing tool and the manufacturing framework. The machine interface can generally be part of an advanced process control (APC) system. The APC system initiates a control script based upon a manufacturing model, which can be a software program that automatically retrieves the data needed to execute a manufacturing process. Often, semiconductor devices are staged through multiple manufacturing tools for multiple processes, generating data relating to the quality of the processed semiconductor devices. Pre-processing and/or post-processing metrology data is supplied to process controllers for the tools. Operating recipe parameters are calculated by the process controllers based on the performance model and the metrology information to attempt to achieve post-processing results as close to a process target value as possible. Reducing variation in this manner leads to increased throughput, reduced cost, higher device performance, etc., all of which equate to increased profitability.

Process control is becoming increasingly important in the semiconductor industry as production specifications are becoming less tolerant to variance in product quality. Historically, semiconductor process control has consisted of independent unit operation run-to-run controllers where the process targets are determined by individual operation models and do not consider the process as a whole. Run-to-run controllers have been employed to control these independent unit operations, such as chemical mechanical planarization, chemical vapor deposition, rapid thermal annealing, plasma etching, etc., and the run-to-run control algorithms, which are designed to maintain the unit operations at the desired process targets, are well understood. A run-to-run controller typically focuses on only one process and its associated process target value. Each run-to-run controller attempts to achieve its process target value within an acceptable range of variation. The process target value is typically set near the middle of a range of acceptable values for the characteristic controlled. However, there are typically numerous process steps that affect the outcome of a particular performance characteristic of the completed device. Because each individual process has its own process target value and controller attempting to reach that process target value, it is difficult to control the performance characteristic.

In some cases, electrical measurements that determine the performance of the fabricated devices are not conducted until relatively late in the fabrication process, and sometimes not until the final test stage. This lag between the fabrication of the devices and the measurement of their performance characteristics makes it difficult to automatically control the fabrication processes to achieve the performance goals.

Typically, the performance characteristics (e.g., speed, contact resistance, power consumption, etc.) of the devices manufactured are indirectly controlled by controlling the physical characteristics of the devices based on the design values determined for the dimensions and materials for the features. Variations in the actual device characteristics from the process target values cause corresponding variation in the performance characteristics. In some cases, a plurality of sources of variation may combine in an additive fashion to cause the electrical performance characteristics of the completed devices to be degraded or entirely unacceptable.

Typically, there may be more than one set of design or process target values that can be used to achieve a particular performance characteristic goal. However, because an indirect method of controlling the electrical performance characteristics is employed, the process target values are typically static. In some situations, one or more of the fabrication processes may have difficulty reliably meeting its process target. Various factors, such as tool cleanliness, age of consumable items, etc., can affect the performance and controllability of a tool. This variation from target deleteriously affects the electrical performance characteristics of the completed devices in a manner that is not readily accounted for by indirect control.

The present invention is directed to overcoming, or at least reducing the effects of, one or more of the problems set forth above.

SUMMARY OF THE INVENTION

One aspect of the present invention is seen in a method that includes defining a model of a process for manufacturing a device, the process including a plurality of steps. A plurality of inline process targets are defined for at least a subset of the process steps. The model relates the inline process targets to a plurality of process output parameters. A first set of probabilistic constraints for the inline process targets is defined. A second set of probabilistic constraints for the process output parameters is defined. An objective function is defined based on the model and the plurality of process output parameters. A trajectory of the process output parameters is determined by optimizing the objective function subject to the first and second sets of probabilistic constraints for each process step to determine values for the inline process targets at each process step, the optimization being iterated after completion of each process step for the remaining process steps.

Another aspect of the present invention is seen in a system including a plurality of tools for manufacturing a device over a plurality of steps, a plurality of process controllers associated with at least a subset of the tools, and a supervisory controller. Each process controller is configured to control the processing of at least one associated tool based on an inline process target. The supervisory controller is configured to employ a model of the processing steps for manufacturing the device, the model relating the inline process targets to a plurality of process output parameters, define a first set of probabilistic constraints for the inline process targets, define a second set of probabilistic constraints for the process output parameters, define an objective function based on the model and the plurality of process output parameters, and determine a trajectory of the process output parameters by optimizing the objective function subject to the first and second sets of probabilistic constraints for each process step to determine values for the inline process targets at each process step having an associated process controller, the optimization being iterated after completion of each process step for the remaining process steps.

BRIEF DESCRIPTION OF THE DRAWINGS

The invention may be understood by reference to the following description taken in conjunction with the accompanying drawings, in which like reference numerals identify like elements, and in which.

Figure 1:
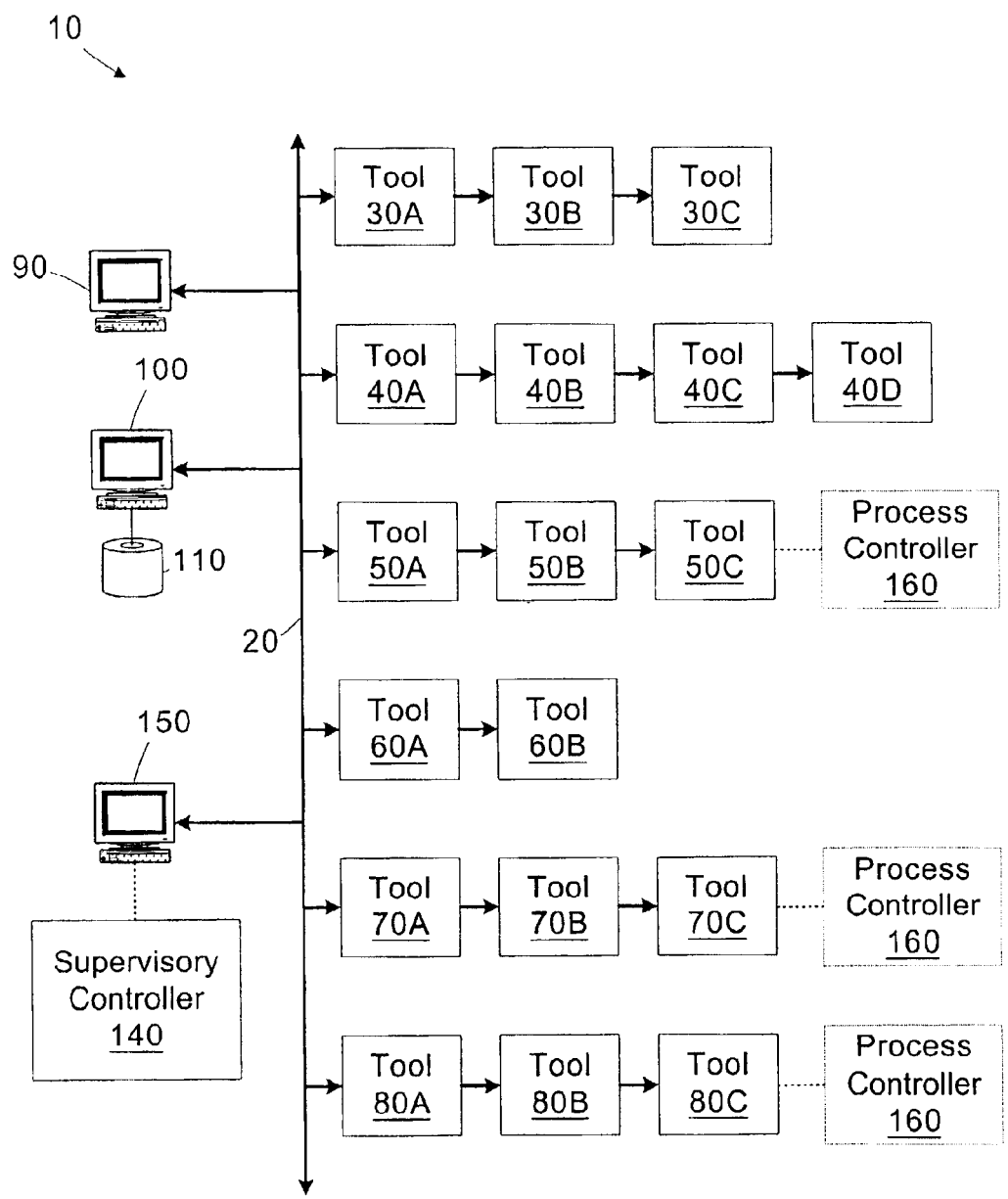
FIG. 1 is a simplified block diagram of a manufacturing system in accordance with one illustrative embodiment of the present invention.

While the invention is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION OF SPECIFIC EMBODIMENTS

Illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

Referring to FIG. 1, a simplified block diagram of an illustrative manufacturing system 10 is provided. In the illustrated embodiment, the manufacturing system 10 is adapted to fabricate semiconductor devices. Although the invention is described as it may be implemented in a semiconductor fabrication facility, the invention is not so limited and may be applied to other manufacturing environments. The techniques described herein may be applied to a variety of workpieces or manufactured items, including, but not limited to, microprocessors, memory devices, digital signal processors, application specific integrated circuits (ASICs), or other devices. The techniques may also be applied to workpieces or manufactured items other than semiconductor devices.

A network 20 interconnects various components of the manufacturing system 10, allowing them to exchange information. The illustrative manufacturing system 10 includes a plurality of tools 30–80. Each of the tools 30–80 may be coupled to a computer (not shown) for interfacing with the network 20. The tools 30–80 are grouped into sets of like tools, as denoted by lettered suffixes. For example, the set of tools 30A–30C represent tools of a certain type, such as a chemical mechanical planarization tool. A particular wafer or lot of wafers progresses through the tools 30–80 as it is being manufactured, with each tool 30–80 performing a specific function in the process flow. Exemplary processing tools for a semiconductor device fabrication environment include metrology tools, photolithography steppers, etch tools, deposition tools, polishing tools, rapid thermal processing tools, implantation tools, etc. The tools 30–80 are illustrated in a rank and file grouping for illustrative purposes only. In an actual implementation, the tools 30–80 may be arranged in any physical order or grouping. Additionally, the connections between the tools in a particular grouping are meant to represent connections to the network 20, rather than interconnections between the tools 30–80.

A manufacturing execution system (MES) server 90 directs the high level operation of the manufacturing system 10. The MES server 90 monitors the status of the various entities in the manufacturing system 10 (i.e., lots, tools 30–80) and controls the flow of articles of manufacture (e.g., lots of semiconductor wafers) through the process flow. A database server 100 is provided for storing data related to the status of the various entities and articles of manufacture in the process flow. The database server 100 may store information in one or more data stores 110. The data may include pre-process and post-process metrology data, tool states, lot priorities, etc.

Portions of the invention and corresponding detailed description are presented in terms of software, or algorithms and symbolic representations of operations on data bits within a computer memory. These descriptions and representations are the ones by which those of ordinary skill in the art effectively convey the substance of their work to others of ordinary skill in the art. An algorithm, as the term is used here, and as it is used generally, is conceived to be a self-consistent sequence of steps leading to a desired result. The steps are those requiring physical manipulations of physical quantities. Usually, though not necessarily, these quantities take the form of optical, electrical, or magnetic signals capable of being stored, transferred, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise, or as is apparent from the discussion, terms such as "processing" or "computing" or "calculating" or "determining" or "displaying" or the like, refer to the action and processes of a computer system, or similar electronic computing device, that manipulates and transforms data represented as physical, electronic quantities within the computer system's registers and memories into other data similarly represented as physical quantities within the computer system memories or registers or other such information storage, transmission or display devices.

The manufacturing system 10 also includes a supervisory controller 140 executing on a workstation 150. The supervisory controller 140 interfaces with one or more process controllers 160 (e.g., run-to-run controllers) associated with individual tools 30–80. The process controllers 160 determine control actions for controlling selected ones of the tools 30–80 serving as process tools based on metrology data collected during the fabrication of wafers (i.e., by others of the tools 30–80 serving as metrology tools). The particular control models used by the process controllers 160 depend on the type of tool 30–80 being controlled. The control models may be developed empirically using commonly known linear or non-linear techniques. The control models may be relatively simple equation-based models (e.g., linear, exponential, weighted average, etc.) or a more complex model, such as a neural network model, principal component analysis (PCA) model, partial least squares projection to latent structures (PLS) model. The specific implementation of the control models may vary depending on the modeling techniques selected and the process being controlled. The selection and development of the particular control models would be within the ability of one of ordinary skill in the art, and accordingly, the control models are not described in greater detail herein for clarity and to avoid obscuring the instant invention.

The supervisory controller 140 interfaces with the process controllers 160 to set the process targets they use in controlling their associated tools 30–80. In general, the supervisory controller 140 selects the process targets to solve an optimal trajectory of the wafer through the steps of the manufacturing process that affect a particular performance characteristic.

An exemplary information exchange and process control framework suitable for use in the manufacturing system 10 is an Advanced Process Control (APC) framework, such as may be implemented using the Catalyst system offered by KLA-Tencor, Inc. The Catalyst system uses Semiconductor Equipment and Materials International (SEMI) Computer Integrated Manufacturing (CIM) Framework compliant system technologies and is based the Advanced Process Control (APC) Framework. CIM (SEMI E81-0699—Provisional Specification for CIM Framework Domain Architecture) and APC (SEMI E93-0999—Provisional Specification for CIM Framework Advanced Process Control Component) specifications are publicly available from SEMI, which is headquartered in Mountain View, Calif.

The processing and data storage functions are distributed amongst the different computers or workstations in FIG. 1 to provide general independence and central information storage. Of course, different numbers of computers and different arrangements may be used without departing from the spirit and scope of the instant invention.

The following discussion focuses on the application of the supervisory controller 140 to a fabrication process for producing a flash memory device, however, the application of the present invention is not so limited and may be applied to other types of devices and workpieces or manufactured items other than semiconductor devices. Depending on the complexity of the flash memory device, flash memory manufacturing consists of between 30 and 100 individual process steps which include crystal growth, oxidation, deposition (dielectrics, silicon, metals), physical vapor deposition, dopant diffusion, dopant ion implantation, photolithography, etch, and chemical mechanical polishing. Although the supervisory controller 140 could, feasibly, be used throughout the manufacturing process to generate process targets for each of these unit operations, the complexity of the system may be reduced by identifying a subset of the process steps that have the most significant impact on the particular performance characteristic being controlled. In one example, six to ten manufacturing steps that determine the majority of the electrical properties and performance of the device may be identified and controlled by the supervisory controller 140. The particular process steps selected depend on the particular type of device being manufactured and the particular performance characteristic being controlled.

Exemplary performance characteristics for flash memory devices include program/erase cycle time, delta VT erase, etc. Exemplary performance characteristics for logic circuits include drive current, ring oscillator frequency, threshold voltage, contact resistance, etc. Exemplary characteristics that may be controlled that affect the performance characteristics of a flash memory device are tunnel oxide thickness, floating gate width, floating gate length, control gate width, high temperature oxide thickness, nitride thickness, deposited oxide thickness, rapid thermal annealing temperature or time, implant dose. Exemplary characteristics that may be controlled that affect the performance characteristics of a logic device are gate oxide width, gate length, gate width, implant dose or energy, plasma etch parameters, rapid thermal anneal temperature or time, spacer width, etc.

The supervisory controller 140 employs a model for the manufacturing of the devices developed from process data. Partial least squares (PLS) regression may be used to reduce the dimensionality of the data by projecting the data onto a set of orthogonal latent variables. This projection allows for a more robust model as less data is necessary to produce an accurate model. For instance, if it is desired to model 50 data points with 20 independent variables, the resulting model could be based nearly entirely on process noise (an inaccurate model), but would report a deceivingly large amount of variance captured by the model. With PLS, on the other hand, the 20 independent variables could be reduced to a set of orthogonal variables such that the data would be modeled with significantly less independent variables. Modeling 50 data points with two or three variables is much more robust than modeling with 20 variables. A second benefit of PLS modeling (as compared to ordinary least squares regression) is the ability to regress rank deficient data.

By assuming that an input matrix, X, and an output matrix, Y, are linearly related by, $$Y = XC + V, \qquad (1)$$

PLS regression builds a linear model by first projecting the input, X matrix and output Y matrix onto a set of orthogonal latent variables, $$X = t_1 p_1^T + E_1 \quad (2)$$

$$Y = u_1 q_1^T + F_1 \quad (3)$$

where $t_1$ and $u_1$ are the scores (determined from the eigenvectors corresponding to the largest eigenvalue of $XX^TYY^T$ and $YY^TXX^T$, respectively), $p_1$ and $q_1$ are the corresponding loading matrices, and $E_1$ and $F_1$ are the residual matrices. The latent score vectors are then related by a linear inner model, $$u_h = t_h b_h + r_h \quad (4)$$

where $b_h$ is determined through ordinary least squares regression. The process is then repeated on the residuals for the next factor and the number of factors is determined through cross validation.

Semiconductor manufacturing often experiences slow time-varying changes in the process due to degradation in tool performance. To compensate for these drifts, the model may be recursively updated with exponentially discounted older data. A recursive PLS algorithm may be used that updates the model using blocks of new data which are exponentially discounted and a moving window approach where older data is systematically excluded from the process model.

One of the challenges associated with recursive least squares modeling is persistent excitation. Problems with persistent excitation result from a closed loop system not varying enough to excite all of the nodes of the system. If older data is being discounted and there is no process information in new data, then the covariance matrix becomes very ill-conditioned and the system can become unstable. One technique for avoiding this situation involves adding a small amount of noise to controller inputs to ensure that adequate information is available in the closed loop system. A disadvantage of this excitation technique is that the added noise reduces the performance of the controller. A second solution to the persistent excitation problem is to use a variable forgetting factor. Using a forgetting factor close to unity results in all of the data being counted equally, that is, the data is not exponentially discounted. On the other hand, by decreasing the forgetting factor, older data is discounted quicker and more emphasis is placed on the newest data. With this in mind, the amount of information available in the initial data set is quantified and a forgetting factor is chosen that keeps this factor constant.

Once a model has been created, the supervisory controller 140 chooses process targets for the process controllers 160 to optimize an objective function. In the illustrated embodiment, the objective function employed is:

$$\min_x J = (\hat{y} - T)^T Q (\hat{y} - T) + (x - \bar{x})^T R (x - \bar{x}) + \Delta x^T S \Delta x, \quad (5)$$

subject to the constraints:

$$\hat{y} = xC$$

$$x_{min} \leq x \leq x_{max}$$

$$\Delta x_{min} \leq x \leq \Delta x_{max}$$

$$\hat{y}_{min} \leq \hat{y} \leq \hat{y}_{max}$$

where $\hat{y}$ is a column vector with the estimates of the process outputs, x is a column vector containing the process inputs (inline process targets), C is the matrix of coefficients from the recursive PLS model, and T is a vector containing the process output targets. The weighting matrices, Q, R, and S are assumed to be positive definite. The range represented by $x_{min}$ and $x_{max}$ represents constraints on the process targets. The range defined by $\Delta x_{min}$ and $\Delta x_{max}$ sets limits on the size of a step change that is allowed to the inline process target values. The ranges thus operate to ensure that the process targets are within the predetermined range and are not changed by too great an amount. Likewise, the range defined by $y_{min}$ and $y_{max}$ represents constraints on the output characteristics (e.g., dimension of a feature). The solution to the type of problem described by Equation 5 can be found using a quadratic program, such as MATLAB® offered by The MathWorks, Inc., of Natick, Mass.

Figure 2:
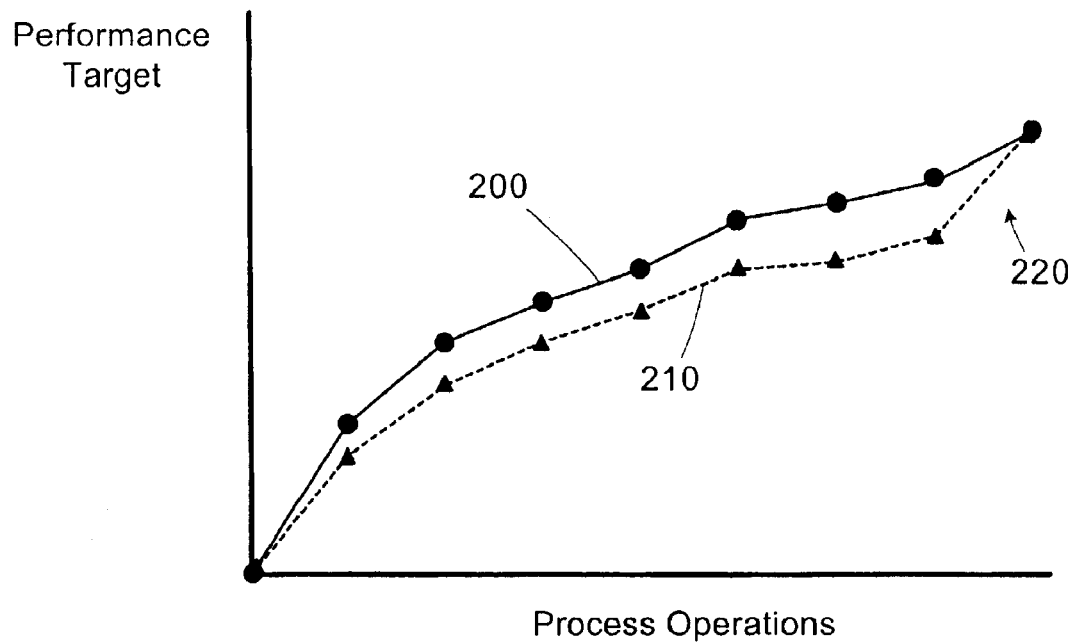
FIG. 2 is a graph illustrating optimal and actual trajectories generated by solving an optimization using constraints on process targets and outputs.

FIG. 2 is a graph illustrating an optimal wafer trajectory 200 and an actual wafer trajectory 210 for an optimization using the constraints defined in Equation 5. Each point on the wafer trajectories 200, 210 represents one of the process steps. FIG. 2 illustrates the potential for constraint violation due to a plant-model mismatch and normal operational fluctuations around the inline process targets. Due to plant model mismatch and/or normal process fluctuations around the inline process targets, the actual wafer trajectory 210 is lower than the optimal trajectory 200. Since the prediction horizon contracts as the number of remaining processing steps decreases, the supervisory controller 140 may be unable to reach the desired quality target without violating one or more of the inline constraints at a later process step, as indicated by constraint violation 220.

A limitation of the optimization described by Equation 5 with the specified constraints is that in a semiconductor manufacturing environment there is a large amount of uncertainty in the model parameters and in the manipulated variables themselves, since they are being controlled by the run-to-run process controllers 160. Sources of uncertainty include model uncertainty (e.g., structural/parametric mismatch), market uncertainty (e.g., process economics/raw materials), measurement uncertainty (e.g., sensor errors), and process uncertainties (e.g., ambient conditions, feedstock quality). If the nominal solution to Equation 5 results in a solution that includes setting an inline process target at a constraint, then it is fair to say that the constraint will be violated up to half of the time due to normal fluctuations around the inline process target.

Figure 3:
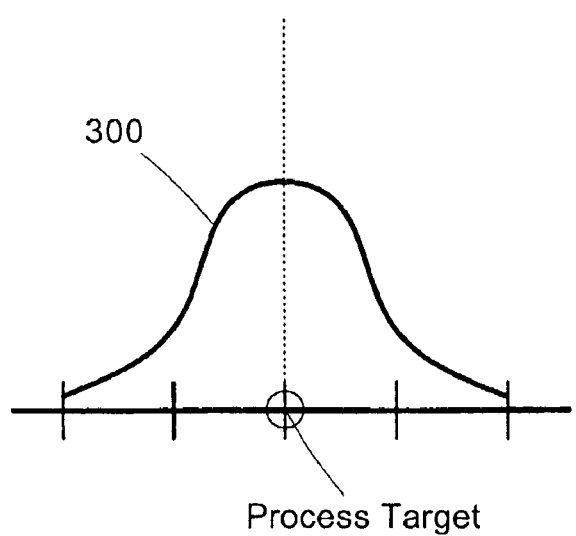
FIG. 3 is a graph illustrating a probability distribution associated with a tool meeting its process target.

FIG. 3 is a graph illustrating the performance of one of the tools 30–80 with respect to its ability to meet a process target. There is a predictable distribution 300 about the process target representing the probability that the target will be reached. The distribution 300 may be determined empirically based on the historical performance of a particular process tool or type of process tool. The distribution 300 may change depending on the current operating state of the tool 30–80. For example, a tool health metric may be determined for a tool based on a comparison of its current operating conditions (e.g., pressure, temperature, gas flow, etc.) to expected values for those parameters derived from the operating recipe employed. As the difference between the observed and predicted values increase, the tool health decreases. A tool 30–80 with a higher tool health metric may be better able to meet its process target, and would thus have a tighter distribution 300. Similarly, a tool 30–80 with a lower health metric would tend to have a wider distribution 300.

To address this situation, the supervisory controller 140 employs an optimization that explicitly takes into account the uncertainties. The probability of the constraint violation is factored into the optimization. In this respect, the supervisory controller 140 ensures that the constraints are respected to some acceptable level of probability. With this in mind, the constraints in (5) are modified to be:

$$P(x_{min} \leq x \leq x_{max}) \geq \rho_x$$

$$P(\Delta x_{min} \leq x \leq \Delta x_{max}) \geq \rho_{\Delta x} \qquad (6)$$

$$P(\hat{y}_{min} \leq \hat{y} \leq \hat{y}_{max}) \geq \rho_y,$$

where P represents a probability that the constraint will be met and $\rho$ represents a probability threshold.

Generally, there are two classes of probability constrained problems; individual probability constrained (IPC) and joint probability constrained (JPC). In the IPC case, each variable is considered independently and it is desired to guarantee, with a given probability, that the constraints are not violated. The IPC approach does not consider the system as a whole. To solve the IPC optimization, the supervisory controller 140 may include a margin in the constraints:

$$(x_{min}+b_x) \leq x \leq (x_{max}-b_x)$$

$$(\Delta x_{min}+b_{\Delta x}) \leq \Delta x \leq (\Delta x_{max}-b_{\Delta x})$$

$$(\hat{y}_{min}+b_y) \leq \hat{y} \leq (\hat{y}_{max}-b_y) \qquad (7)$$

The back-offs, $b_i$, are determined from an assumed distribution to solve IPC for a given $\rho i$. If no feasible solution exists then the supervisory controller 140 increases $\rho$ until a feasible solution exists.

In one embodiment, the supervisory controller 140 may employ JPC approach, which considers the probability of all of the constraints being met simultaneously. Exemplary approaches for solving this system of constraints in Equation 6 include a Monte-Carlo technique or the use of a cumulative distribution function of an assumed multivariate distribution. The implementation of techniques for solving the constraint problem using either the IPC or JPC approaches is known to those of ordinary skill in the art, and is thus not described in greater detail herein for clarity and to avoid obscuring the present invention.

The operation of the supervisory controller 140 in solving the optimization problem is now described in greater detail with reference to FIGS. 1 and 4. The supervisory controller 140 determines a subset of the tools 30–80 for performing the required processing steps on the wafer. The supervisory controller 140 then determines a solution for the optimization of Equation 5 using the probability constraints defined in Equation 6 and/or Equation 7 (i.e., depending on the particular solution technique chosen) and determines the first inline process target for the process controller 160 associated with a tool 30–80 configured to perform the first process step. Subsequently, the wafer or lot of wafers is processed. Prior to the next process step, the metrology data from the first process step is employed in a feed-forward manner and the supervisory controller 140 once again optimizes the process targets using Equations 5, 6, and/or 7 for the remaining process steps. This iterative process, amounting to model predictive control with a shrinking projection horizon, is repeated for all remaining process steps as the wafer progresses through the fabrication process.

Figure 4:
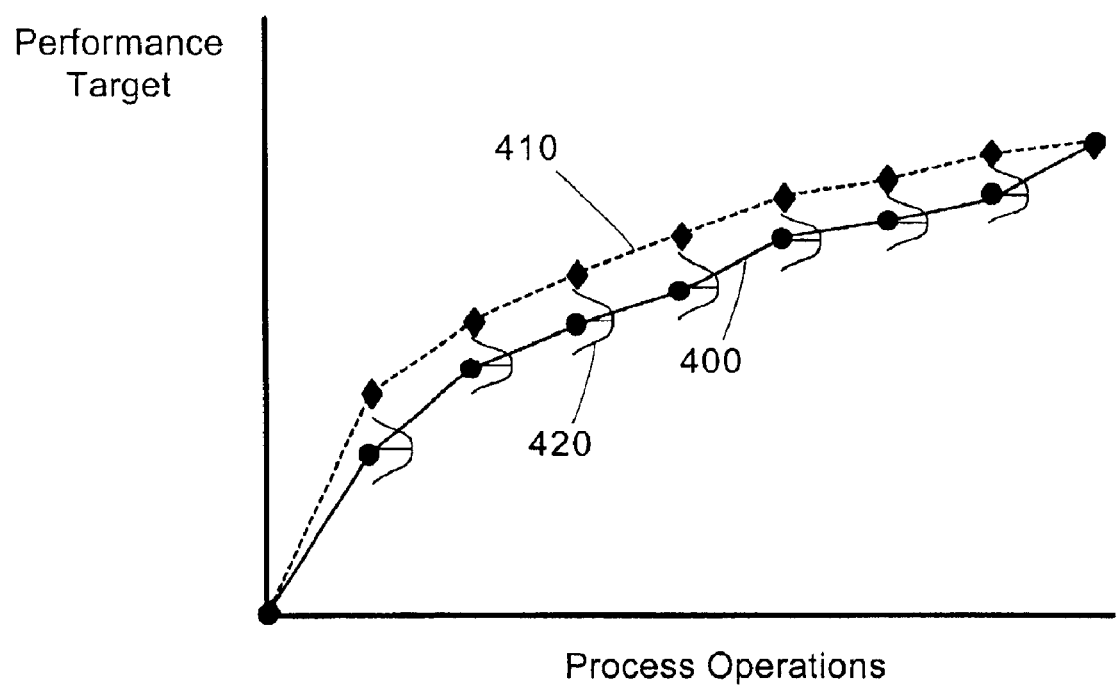
FIG. 4 is a graph illustrating optimal and robust trajectories generated by solving an optimization using probabilistic constraints on process targets and outputs.

FIG. 4 depicts an optimal trajectory 400 and a robust reachability trajectory 410 determined by the techniques described above. The supervisory controller 140 explicitly considers the uncertainty of the inline process targets and thus determines the robust reachability trajectory 410, which acts as a second layer of constraints to guarantee that the quality target could be reached given the uncertainty in the inline process targets (i.e., represented by the distribution curves 420.

It is possible that the robust trajectory constraint may result in an optimization without a solution. In this case three possible solutions to the stochastic optimization trajectory may be considered. First, Equation 5 could be posed as a constraint violation minimization problem. That is, inline process targets could be chosen to minimize the expectation of a constraint violation downstream. Next, a constraint minimization term could be added to Equation 5 to minimize the weighted combination of constraint violation(s) and control energy. Finally, the IPC or JPC problem could be solved with less conservative restrictions on constraint violation.

Figure 5:
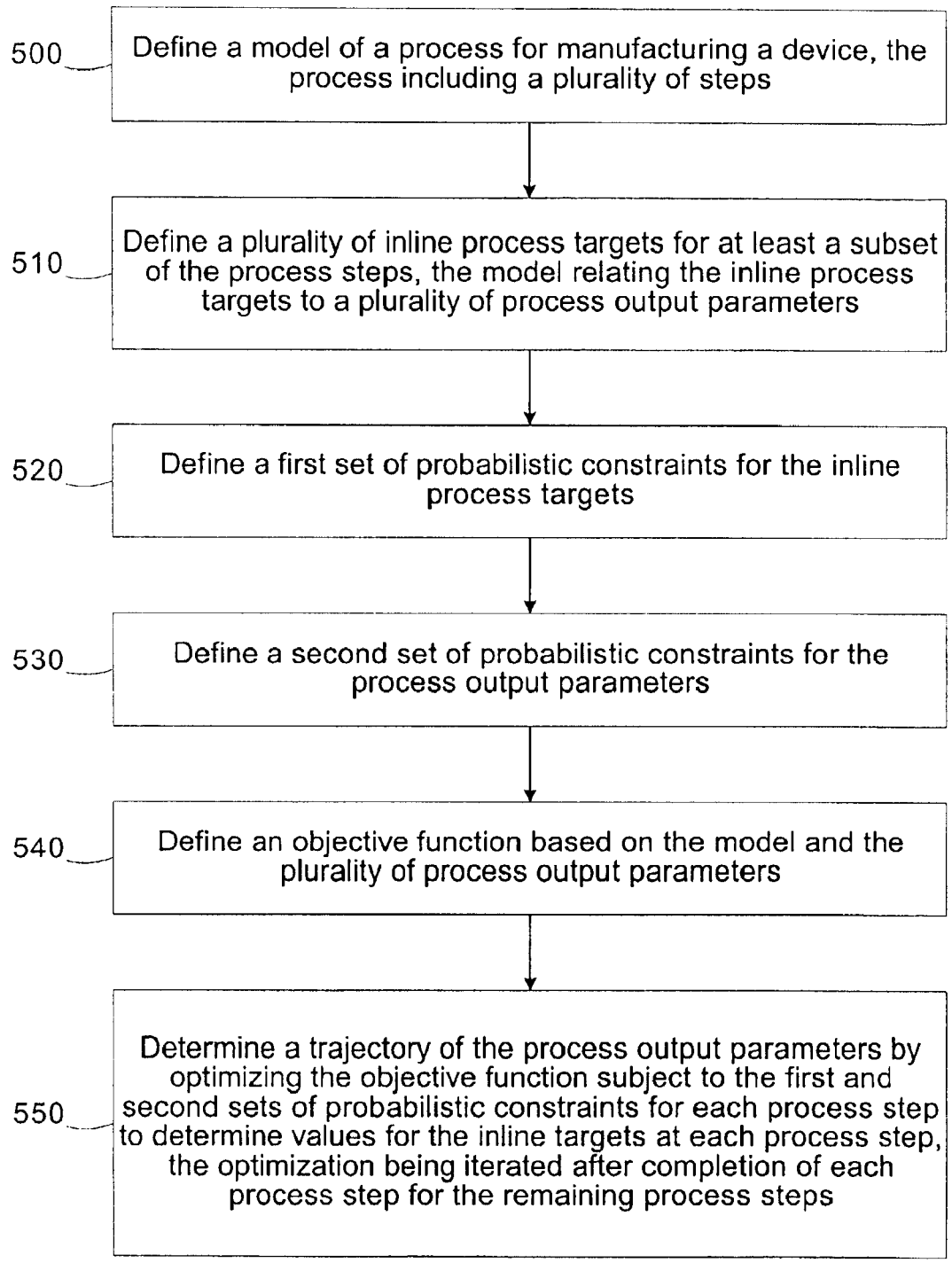
FIG. 5 is a simplified flow diagram for determining process targets for a manufacturing process in accordance with another embodiment of the present invention.

Turning now to FIG. 5, a simplified flow diagram for determining process targets for a manufacturing process in accordance with another embodiment of the present invention is provided. In block 500, a model of a process for manufacturing a device is defined. The process includes a plurality of steps. In block 510, a plurality of inline process targets for at least a subset of the process steps is defined. The model relates the inline process targets to a plurality of process output parameters. In block 520, a first set of probabilistic constraints for the inline process targets is defined. In block 530, a second set of probabilistic constraints for the process output parameters is defined. In block 540, an objective function is defined based on the model and the plurality of process output parameters. In block 550, a trajectory of the process output parameters is determined by optimizing the objective function subject to the first and second sets of probabilistic constraints for each process step to determine values for the inline process targets at each process step. The optimization is iterated after completion of each process step for the remaining process steps.

The particular embodiments disclosed above are illustrative only, as the invention may be modified and practiced in different but equivalent manners apparent to those skilled in the art having the benefit of the teachings herein. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A method, comprising:

defining a model of a process for manufacturing a device, the process including a plurality of steps;

defining a plurality of inline process targets for at least a subset of the process steps, the model relating the inline process targets to a plurality of process output parameters;

defining a first set of probabilistic constraints for the inline process targets;

defining a second set of probabilistic constraints for the process output parameters;

defining an objective function based on the model and the plurality of process output parameters; and determining a trajectory of the process output parameters by optimizing the objective function subject to the first and second sets of probabilistic constraints for each process step to determine values for the inline process targets at each process step, the optimization being iterated after completion of each process step for the remaining process steps.

2. The method of claim 1, wherein optimizing the objective function further comprises optimizing the objective function subject to the first and second sets of constraints using an individual probability constrained technique.

3. The method of claim 1, wherein optimizing the objective function further comprises optimizing the objective function subject to the first and second sets of constraints using a joint probability constrained technique.

4. The method of claim 1, wherein defining the first set of probabilistic constraints further comprises defining probabilistic constraints for a range of the inline process targets.

5. The method of claim 1, wherein defining the first set of probabilistic constraints further comprises defining probabilistic constraints for a range of step sizes for changes in the inline process targets.

6. The method of claim 1, wherein defining the second set of probabilistic constraints further comprises defining probabilistic constraints for a range for the process output parameters.

7. The method of claim 1, wherein defining the first set of probabilistic constraints further comprises defining a back-off for constraints.

8. The method of claim 1, further comprising:
determining that one of the first and second sets of probabilistic constraints may not be met;
modifying at least one of the first and second sets of probabilistic constraints; and
determining the trajectory based on the modified one of the first and second sets of probabilistic constraints.

9. A method, comprising:
defining a model of a process for manufacturing a device, the process including a plurality of steps;
defining a plurality of inline process targets for at least a subset of the process steps, the model relating the inline process targets to a plurality of process output parameters;
defining a first set of constraints for the inline process targets;
defining a second set of constraints for the process output parameters;
determining a first set of values for the inline process targets that when applied to the model for the plurality of steps result in a probability of the first set of constraints being met being greater than a first probability threshold and a probability of the second set of constraints being met being greater than a second probability threshold;
performing a first step of the process using the determined value for the inline process target associated with the first step;
measuring an output parameter associated with the first step;
updating the model based on the measured output parameter; and
determining a second set of values for the inline process targets that when applied to the model for the remaining steps in the plurality of steps result in the probability of the first set of constraints being met being greater than the first probability threshold and the probability of the second set of constraints being met being greater than a second probability threshold.

10. The method of claim 9, wherein determining the first and second sets of values for the inline process targets further comprises:
defining an objective function based on the model and the plurality of process output parameters; and
optimizing the objective function subject to the first and second sets of constraints.

11. The method of claim 10, wherein optimizing the objective function further comprises optimizing the objective function subject to the first and second sets of constraints using an individual probability constrained technique.

12. The method of claim 10, wherein optimizing the objective function further comprises optimizing the objective function subject to the first and second sets of constraints using a joint probability constrained technique.

13. The method of claim 9, wherein defining the first set of constraints further comprises defining a range for the inline process targets.

14. The method of claim 9, wherein defining the first set of constraints further comprises defining a range of step sizes for changes in the inline process targets.

15. The method of claim 9, wherein defining the second set of constraints further comprises defining a range for the process output parameters.

16. The method of claim 9, wherein defining the first set of constraints further comprises defining a backoff for constraints.

17. The method of claim 9, further comprising:
determining that the first set of values for the inline process targets may not be determined such that the probability of the first set of constraints being met is greater than the first probability threshold;
reducing the first probability threshold; and
determining the first set of values for the inline process targets that when applied to the model for the plurality of steps result in the probability of the first set of constraints being met being greater than the reduced first probability threshold.

18. The method of claim 9, further comprising:
determining that the first set of values for the inline process targets may not be determined such that the probability of the second set of constraints being met is greater than the second probability threshold;
reducing the second probability threshold; and
determining the first set of values for the inline process targets that when applied to the model for the plurality of steps result in the probability of the second set of constraints being met being greater than the reduced second probability threshold.

19. A system, comprising:
a plurality of tools for manufacturing a device over a plurality of steps;
a plurality of process controllers associated with at least a subset of the tools, each process controller being configured to control the processing of at least one associated tool based on an inline process target; and
a supervisory controller configured to employ a model of the processing steps for manufacturing the device, the model relating the inline process targets to a plurality of process output parameters, define a first set of probabilistic constraints for the inline process targets, define a second set of probabilistic constraints for the process output parameters, define an objective function based on the model and the plurality of process output parameters, and determine a trajectory of the process output parameters by optimizing the objective function subject to the first and second sets of probabilistic constraints for each process step to determine values for the inline process targets at each process step having an associated process controller, the optimization being iterated after completion of each process step for the remaining process steps.

20. The system of claim 19, wherein the supervisory controller is further configured to optimize the objective function subject to the first and second sets of constraints using an individual probability constrained technique.

21. The system of claim 19, wherein the supervisory controller is further configured to optimize the objective function subject to the first and second sets of constraints using a joint probability constrained technique.

22. The system of claim 19, wherein the supervisory controller is further configured to define the probabilistic constraints for a range of the inline process targets.

23. The system of claim 19, wherein the supervisory controller is further configured to define probabilistic constraints for a range of step sizes for changes in the inline process targets.

24. The system of claim 19, wherein the supervisory controller is further configured to define probabilistic constraints for a range for the process output parameters.

25. The system of claim 19, wherein the supervisory controller is further configured to define a backoff for constraints.

26. The system of claim 19, wherein the supervisory controller is further configured to determine that one of the first and second sets of probabilistic constraints may not be met, modify at least one of the first and second sets of probabilistic constraints, and determine the trajectory based on the modified one of the first and second sets of probabilistic constraints.

27. A system, comprising:

means for manufacturing a device over a plurality of steps;

means for controlling the processing over the plurality of steps based on an inline process target for at least a subset of the steps;

means for defining a model of the processing steps for manufacturing the device, the model relating the inline process targets to a plurality of process output parameters;

means for defining a first set of probabilistic constraints for the inline process targets and a second set of probabilistic constraints for the process output parameters;

means for defining an objective function based on the model and the plurality of process output parameters; and means for determining a trajectory of the process output parameters by optimizing the objective function subject to the first and second sets of probabilistic constraints for each process step to determine values for the inline process targets at each process step having an associated process controller, the optimization being iterated after completion of each process step for the remaining process steps.

* * * * *